(12) United States Patent
Ishikawa (10) Patent No.: US 7,842,356 B2
(45) Date of Patent: *Nov. 30, 2010

(54) SUBSTRATE PROCESSING METHODS

(75) Inventor: Hiraku Ishikawa, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 810 days.

This patent is subject to a terminal disclaimer.

(21) Appl. No.: 11/453,077

(22) Filed: Jun. 15, 2006

(65) Prior Publication Data

US 2007/0062453 A1    Mar. 22, 2007

(30) Foreign Application Priority Data

Jun. 15, 2005 (JP) ............................ 2005-175548

(51) Int. Cl.
*H05H 1/24* (2006.01)
*C23C 16/26* (2006.01)

(52) U.S. Cl. ............... 427/577; 427/249.7; 427/374.6; 427/376.1

(58) Field of Classification Search ............... 427/577, 427/249.7, 374.6, 376.1
See application file for complete search history.

(56) References Cited

U.S. PATENT DOCUMENTS

| | | | |
|---|---|---|---|
| 4,634,648 A * | 1/1987 | Jansen et al. ................ | 430/84 |
| 4,882,256 A * | 11/1989 | Osawa et al. ................ | 430/66 |
| 5,000,831 A | 3/1991 | Osawa et al. | |
| 5,981,000 A | 11/1999 | Grill et al. | |
| 6,197,704 B1 * | 3/2001 | Endo et al. ................ | 438/781 |
| 6,372,303 B1 * | 4/2002 | Burger et al. ............. | 427/569 |
| 6,423,384 B1 | 7/2002 | Khazeni et al. | |
| 6,573,030 B1 * | 6/2003 | Fairbairn et al. ........... | 430/323 |
| 6,669,825 B2 * | 12/2003 | Ohmi et al. ............ | 204/192.12 |
| 7,109,098 B1 * | 9/2006 | Ramaswamy et al. ....... | 438/513 |
| 7,312,148 B2 * | 12/2007 | Ramaswamy et al. ....... | 438/660 |
| 2005/0112509 A1 * | 5/2005 | Fairbairn et al. ........... | 430/322 |

FOREIGN PATENT DOCUMENTS

| JP | 4-229277 | * | 8/1992 |
|---|---|---|---|
| JP | 7-242493 A | | 9/1995 |
| JP | 11-297686 A | | 10/1999 |
| JP | 2002-12972 A | | 1/2002 |
| JP | 2002-164286 A | | 6/2002 |
| JP | 2004-314407 | * | 11/2004 |
| JP | 2005-150612 A | | 6/2005 |

OTHER PUBLICATIONS

Sunil, D., et al., "Infrared Studies of Amorphous Carbon Films Formed by Plasma Decomposition of Acetylene". J. Mater. Eng. (1990) 12 pp. 121-126. p. 121 Only.*
Konshina, E.A., et al., "Vibrational Spectra of Carbon Films obtained from acetylene plasma". Journal of Applied Spectroscopy, vol. 48, No. 6, Jun. 1998 pp. 624-628.*
Louh, S.P., et al., "Effects of acetylene on property of plasma amorphous carbon films". Thin Solid Films 498 (2006) pp. 235-239.*
Gielen, J.W.A.M., et al., "Amorphous hydrogenated carbon films deposited with an expanding thermal plasma". Supplement a la Revue "LeVide: science, technique et applications" No. 275, janvier-fevrier-mars 1995, pp. 226-229.*
Chen, Xiao-Hua, et al., "Deposition and etching of amorphous carbon films prepared by ecr-plasma-enhanced benzene chemical vapor deposition". Mat. Res. Soc. Symp. Proc. vol. 555, 1999, pp. 315-320.*
Japanese Office Action dated Mar. 31, 2009 with English translation (five (5) pages).
Taiwan Office Action dated Jul. 30, 2009.

* cited by examiner

*Primary Examiner*—Bret Chen
(74) *Attorney, Agent, or Firm*—Crowell & Moring LLP (57) ABSTRACT

Substrate processing methods involve forming an insulating film of amorphous carbon on a substrate by supplying acetylene gas and hydrogen gas with a volume ratio of 4:3 to 4:1, or alternatively, butyne gas, into a process vessel in which the substrate is accommodated. The methods further involve generating a plasma inside of the process vessel by emitting a microwave. The pressure inside of the process vessel is maintained to be 4.0 Pa or less and the substrate is maintained to be 200° C. or less while the insulating film is formed.

12 Claims, 9 Drawing Sheets

SUBSTRATE PROCESSING METHODS

BACKGROUND OF THE INVENTION

1. Field of the Invention

The present invention relates to a substrate processing method, a computer readable recording medium and a substrate processing apparatus.

2. Description of the Related Art

For example, in a manufacturing process of electronic devices such as a semiconductor device, a liquid crystal display device and an organic EL element, an interlayer insulating film, for example, to insulate between wirings is formed on a substrate. In recent years, a development of an interlayer insulating film with low dielectric constant has been advanced to realize further elimination of a resistance and a capacitance of this wiring portion.

Conventionally, a polymeric film containing fluorine has attracted attention as a film material of the insulating film capable of realizing the low dielectric constant. However, when this polymeric film is used, there is a possibility that a fluorine atom within the film reacts with surrounding moisture while a substrate is processed, and hydrogen fluoride gas is emitted from inside of the film to destruct and peel off peripheral films. Consequently, it is proposed that amorphous carbon in which the same degree of low dielectric constant can be obtained is used as the film material of the insulating film instead of the polymeric film containing fluorine.

At present, a method is proposed as a deposition method of amorphous carbon, in which cyclic hydrocarbon gas is supplied into a chamber and a plasma is generated inside of the chamber to thereby from a film by using a parallel plate type plasma CVD apparatus (refer to U.S. Pat. No. 5,981,000). In this deposition method using the parallel plate type plasma CVD apparatus, a bias voltage is applied to a substrate inside of the chamber, charged particles within the plasma are attracted to a surface of the substrate, and thereby, an insulating film is formed on the substrate.

However, when the above-stated deposition method is used, a value of a dielectric constant (k value) of the insulating film was approximately 3.5. It is necessary to realize the insulating film having lower dielectric constant to realize a high speed and low power consumption of the electronic device. Besides, when the above-stated deposition method is used, a heat resistance of the film is bad, and therefore a film thickness may vary or a film quality may deteriorate, for example, at a heating process of the substrate.

SUMMARY OF THE INVENTION

The present invention is made in consideration of these points, and an object thereof is to form an insulating film of amorphous carbon having lower dielectric constant and better heat resistance.

To attain the above-stated object, a substrate processing method according to the present invention, including the step of: forming an insulating film of amorphous carbon on a substrate by supplying hydrocarbon gas having a multiple bond into a process vessel in which the substrate is accommodated, and generating a plasma inside of the process vessel.

According to a verification of the inventor, the insulating film of amorphous carbon of which dielectric constant is approximately 2.5 is formed by using the substrate processing method according to the present invention. Besides, the insulating film having a significantly high heat resistance is formed by the present invention. As stated above, according to the present invention, the insulating film of amorphous carbon having the lower dielectric constant and higher heat resistance compared to the prior art can be formed.

The hydrocarbon gas is acetylene gas, and hydrogen gas may be supplied into the process vessel in addition to the acetylene gas. Besides, the acetylene gas and the hydrogen gas may be supplied with a volume ratio of 4:3 to 4:1. A leak current of the insulating film can be eliminated by this process.

The hydrocarbon gas may be butyne gas.

A pressure inside of the process vessel may be maintained to be 4.0 Pa or less while the insulating film is formed. Besides, the substrate may be maintained to be 200° C. or less while the insulating film is formed.

The substrate may be heated in an atmosphere containing the hydrogen gas after the insulating film is formed. In such a case, the dielectric constant of the insulating film is further eliminated, and the insulating film with little leak current and good heat resistance can be formed. Incidentally, the substrate may be heated at the temperature of 350° C. to 400° C. after the insulating film is formed. Besides, the substrate may be maintained in the atmosphere not containing oxygen during a period after the insulating film is formed until the substrate is heated.

In the substrate processing method, the plasma may be generated inside of the process vessel by using a microwave. Besides, inside of the process vessel may be sectionalized into a plasma generation region in which the plasma is generated, and a film formation region in which the insulating film is formed on the substrate by using the plasma generated in the plasma generation region, plasma gas for plasma generation may be supplied to the plasma generation region, and the hydrocarbon gas may be supplied to the film formation region.

The plasma may be generated inside of the process vessel under a state in which a bias voltage is not applied to the substrate inside of the process vessel.

Another aspect of the present invention is a computer readable recording medium recording a program for causing a computer to realize the above-stated substrate processing method.

Another aspect of the present invention is a substrate processing apparatus, including: a control portion performing the substrate processing method.

According to the present invention, the insulating film having low dielectric constant and good heat resistance is realized, and therefore, an electronic device which has higher speed and lower power consumption can be manufactured.

DETAILED DESCRIPTION OF THE INVENTION

Figure 1:
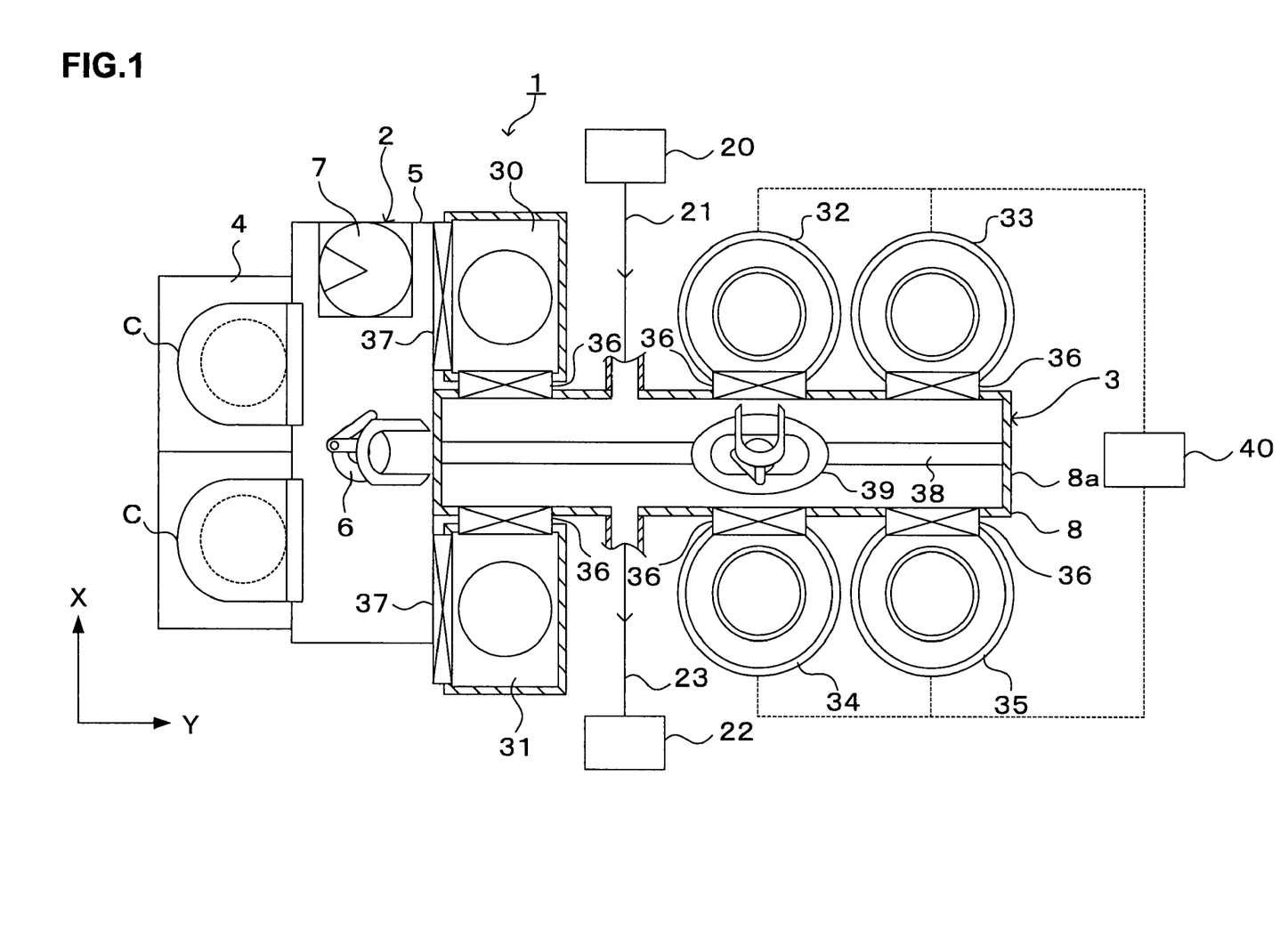
FIG. 1 is an explanatory view schematically showing an outline of a constitution of a substrate processing apparatus in an embodiment.

Hereinafter, preferable embodiments of the present invention are described. FIG. 1 is a plan view showing an outline of a constitution of a substrate processing apparatus 1 in which a substrate processing method according to the present invention is performed.

The substrate processing apparatus 1 has a constitution in which a cassette station 2, for example, carrying in/out plural substrates W to the substrate processing apparatus 1 from external per cassette as a unit and carrying in/out the substrate W to a cassette C, and a processing station 3 including plural various apparatuses processing the substrates W in sheet-fed mode are connected integrally in Y direction (horizontal direction in the drawing).

The cassette station 2 is composed of a cassette mounting table 4 and a carrier chamber 5. At the cassette mounting table 4, plural, for example, two cassettes C can be mounted side by side in X direction (longitudinal direction in FIG. 1). The carrier chamber 5 includes a substrate carrier 6 composed of, for example, a multi-joint robot, and a pre-alignment stage 7. The substrate carrier 6 is able to carry the substrate W to the cassettes C on the cassette mounting table 4, the pre-alignment stage 7, and later-described load lock chambers 30, 31 of the processing station 3.

The processing station 3 includes a carrier path 8 formed in linear state from the cassette station 2 in Y direction (horizontal direction in FIG. 1) at a center portion thereof. Inside of the carrier path 8 is covered by a sealable casing 8a. An air supply pipe 21 communicated with, for example, a gas supply apparatus 20 is connected to the casing 8a. The gas supply apparatus 20 is able to supply inside of the casing 8a with, for example, gas not containing oxygen gas, for example, inert gas and nitrogen gas via the air supply pipe 21. Besides, an exhaust pipe 23 communicated with, for example, an exhaust apparatus 22 is connected to the casing 8a. It is possible to maintain inside of the casing 8a in a gaseous atmosphere not containing the oxygen gas owing to a gas supply from the air supply pipe 21 and an exhaust from the exhaust pipe 23.

At both sides along the X direction sandwiching the carrier path 8, for example, the load lock chambers 30, 31, insulating film forming apparatuses 32, 33, and annealing apparatuses 34, 35 are sequentially disposed along the carrier path 8 from the cassette station 2 side. The respective load lock chambers 30, 31, the insulating film forming apparatuses 32, 33, and the annealing apparatuses 34, 35 are connected to the carrier path 8 via gate valves 36. The load lock chambers 30, 31 are adjacent to the carrier chamber 5 of the cassette station 2, and the load lock chambers 30, 31 and the carrier chamber 5 are connected via gate valves 37. The substrate W inside of the carrier chamber 5 can be carried into the carrier path 8 via, for example, the load lock chambers 30, 31.

A carrier rail 38 extending in Y direction, and a substrate carrier apparatus 39 flexible to move on the carrier rail 38 and composed of a multi-joint robot are provided inside of the carrier path 8. The substrate carrier apparatus 39 moves on the carrier rail 38, and it can carry the substrate W to the load lock chambers 30, 31, the insulating film forming apparatuses 32, 33 and the annealing apparatuses 34, 35 via the respective gate valves 36.

A control portion 40 is provided at the substrate processing apparatus 1 to control, for example, processes of the substrate at the respective apparatuses 32 to 35. The control portion 40 is composed of, for example, a general-purpose computer. Programs to perform, for example, the processes of the substrate are stored at the control portion 40. The control portion 40 outputs instruction signals relating respective processes to the respective apparatuses 32 to 35, and thereby substrate processes at the respective apparatuses 32 to 35 are performed. An interface to install a program from, for example, a recording medium is provided at the control portion 40, and the processes of the respective apparatuses 32 to 35 are performed by the program installed from the recording medium.

Figure 2:
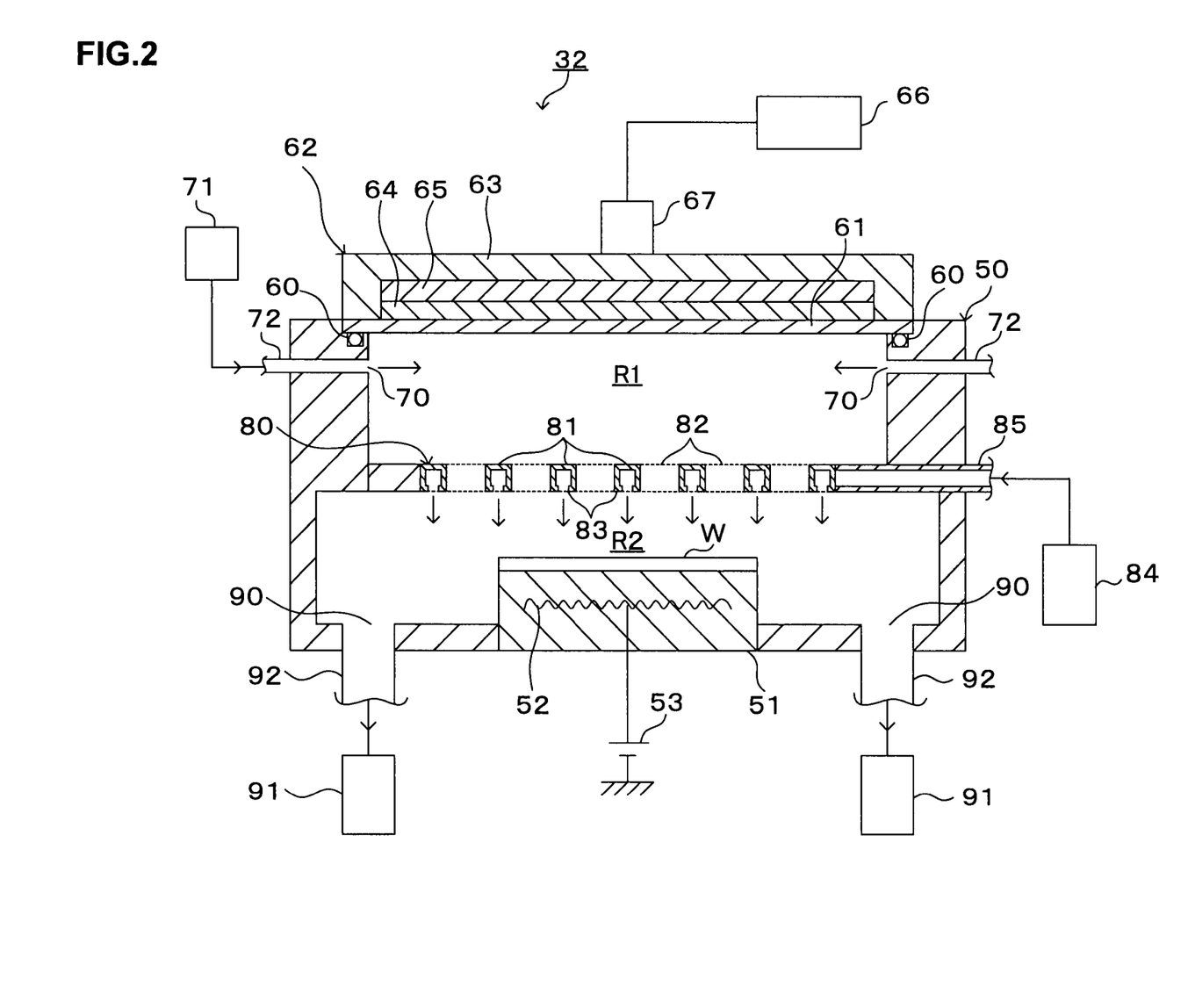
FIG. 2 is an explanatory view of a vertical section showing an outline of a constitution of an insulating film forming apparatus.

Next, a constitution of the above-stated insulating film forming apparatus 32 is described. FIG. 2 is a view schematically showing the constitution of a vertical section of the insulating film forming apparatus 32. The insulating film forming apparatus 32 is a plasma CVD (chemical vapor deposition) apparatus depositing an insulating film of amorphous carbon on the substrate W by using a plasma generated by a microwave.

The insulating film forming apparatus 32 includes, for example, a bottomed cylindrical process vessel 50 opening at an upper surface thereof as shown in FIG. 2. The process vessel 50 is formed by, for example, an aluminum alloy. The process vessel 50 is grounded. A mounting table 51 as a mounting portion to mount, for example, the substrate W is provided at an approximately center portion of a bottom portion of the process vessel 50.

A heater 52 is provided inside of the mounting table 51. The heater 52 is connected to a power source 53 provided outside of the process vessel 50, and it generates heat owing to a power feeding from this power source 53 to heat the mounting table 51 to be a predetermined temperature.

For example, a dielectric window 61 made of quartz glass and so on is provided at an upper opening of the process vessel 50 via a seal member 60 such as an O ring for securing air-tightness. The upper opening of the process vessel 50 is closed by this dielectric window 61. A radial line slot antenna 62 as a high frequency supply portion to supply the microwave for a plasma generation is provided at an upper portion of the dielectric window 61.

The radial line slot antenna 62 includes an approximately cylindrical antenna main body 63 opening at a lower surface. A disc-shaped slot plate 64 in which a number of slots are formed is provided at the opening portion of the lower surface of the antenna main body 63. A slow-plate 65 formed by a low-loss dielectric material is provided at an upper portion of the slot plate 64 inside of the antenna main body 63. A coaxial waveguide 67 leading to a microwave oscillator 66 is connected at an upper surface of the antenna main body 63. The microwave oscillator 66 is provided outside of the process vessel 50, and it can oscillate a microwave of a predetermined frequency, for example, 2.45 GHz to the radial line slot antenna 62. According to the constitution as stated above, the microwave oscillated from the microwave oscillator 66 is propagated into the radial line slot antenna 62, compressed and reduced a wave length at the slow-plate 65, and thereafter, a circular polarization is generated at the slot plate 64, and it is radiated toward inside of the process vessel 50 from the dielectric window 61.

Gas supply ports 70 supplying gas for the plasma generation are formed at an upper inner peripheral surface of the process vessel 50. The gas supply ports 70 are formed, for example, at plural portions along the inner peripheral surface of the process vessel 50. Gas supply pipes 72 communicated with a gas supply source 71, for example, provided outside of the process vessel 50, are connected to the gas supply ports 70. In the present embodiment, argon (Ar) gas being noble gas is stored at the gas supply source 71.

A source gas supply structure 80 having, for example, approximately a flat shape in outline is provided between the mounting table 51 and the radial line slot antenna 62 inside of the process vessel 50. The outline of the source gas supply structure 80 is formed in circular state at least larger than a diameter of the substrate W in a plan view, and provided to face the mounting table 51 and the radial line slot antenna 62. Inside of the process vessel 50 is sectionalized into a plasma generation region R1 at the radial line slot antenna 62 side and a film formation region R2 at the mounting table 51 side by this source gas supply structure 80.

Figure 3:
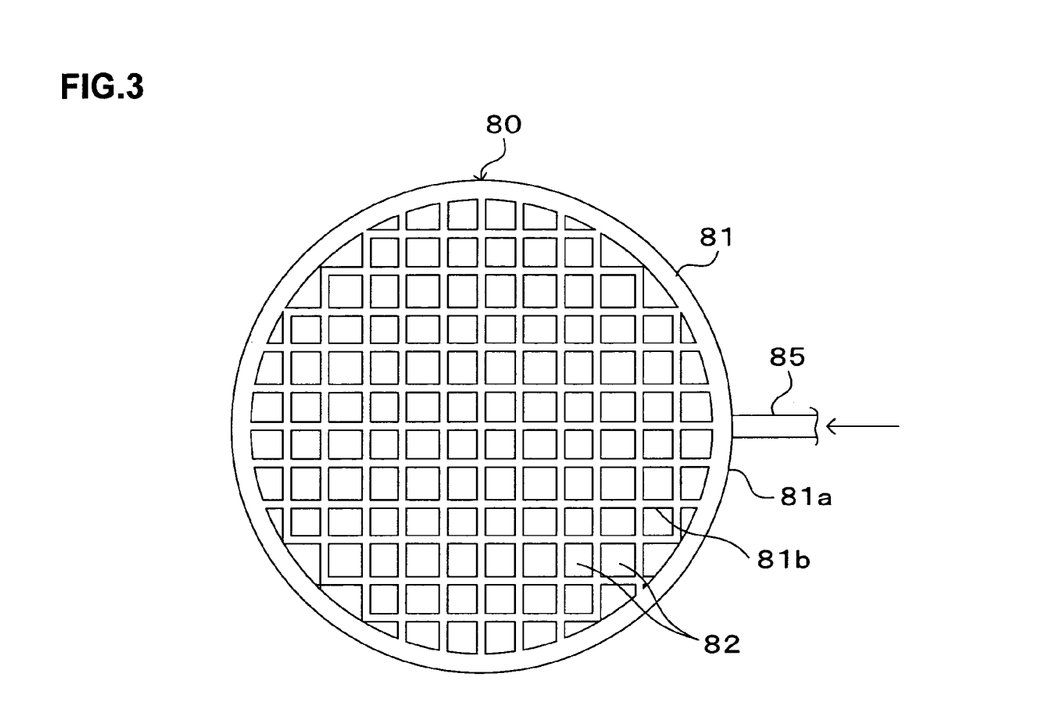
FIG. 3 is a plan view of a source gas supply structure.

The source gas supply structure 80 is composed of source gas supply pipes 81 disposed in an approximately grid on the same plane and connected in series as shown in FIG. 3. The source gas supply pipes 81 are composed of, for example, an annular pipe 81a disposed annularly at an outer peripheral portion of the source gas supply structure 80 and a grid pipe 81b disposed so that plural number of matrix pipes are orthogonal with each other at an inner side of the annular pipe 81a. A vertical section of these source gas supply pipes 81 is formed in square in an axial view, and all of them are communicated with each other.

Besides, the source gas supply structure 80 has a number of opening portions 82 at gaps between the source gas supply pipes 81 disposed in a grid. Charged particles within the plasma generated in the plasma generation region R1 at an upper side of the source gas supply structure 80 go into the film formation region R2 at the mounting table 51 side by passing through these opening portions 82.

At lower surfaces of the source gas supply pipes 81 of the source gas supply structure 80, a number of source gas supply ports 83 are formed as shown in FIG. 2. These source gas supply ports 83 are disposed uniformly within a surface of the source gas supply structure 80. Incidentally, these source gas supply ports 83 may be disposed uniformly only at a region facing the substrate W mounted on the mounting table 51. A gas pipe 85 communicated with a source gas supply source 84 provided outside of the process vessel 50 is connected to the source gas supply pipes 81. Hydrocarbon gas having a multiple bond, for example, $C_4H_6$ (butyne) gas is stored at the source gas supply source 84. Source gas supplied from the source gas supply source 84 to the source gas supply pipes 81 via the gas pipe 85 is discharged from the respective source gas supply ports 83 toward the downward film formation region R2.

Exhaust ports 90 to exhaust an atmosphere inside of the process vessel 50 are provided at a bottom portion of the process vessel 50. Exhaust pipes 92 leading to exhaust apparatuses 91 such as turbo molecular pumps are connected to the exhaust ports 90. It is possible to reduce a pressure inside of the process vessel 50 into a predetermined pressure owing to the exhaust from these exhaust ports 90.

Incidentally, a constitution of the insulating film forming apparatus 33 is the same as the insulating film forming apparatus 32, and the description thereof will not be given.

Figure 4:
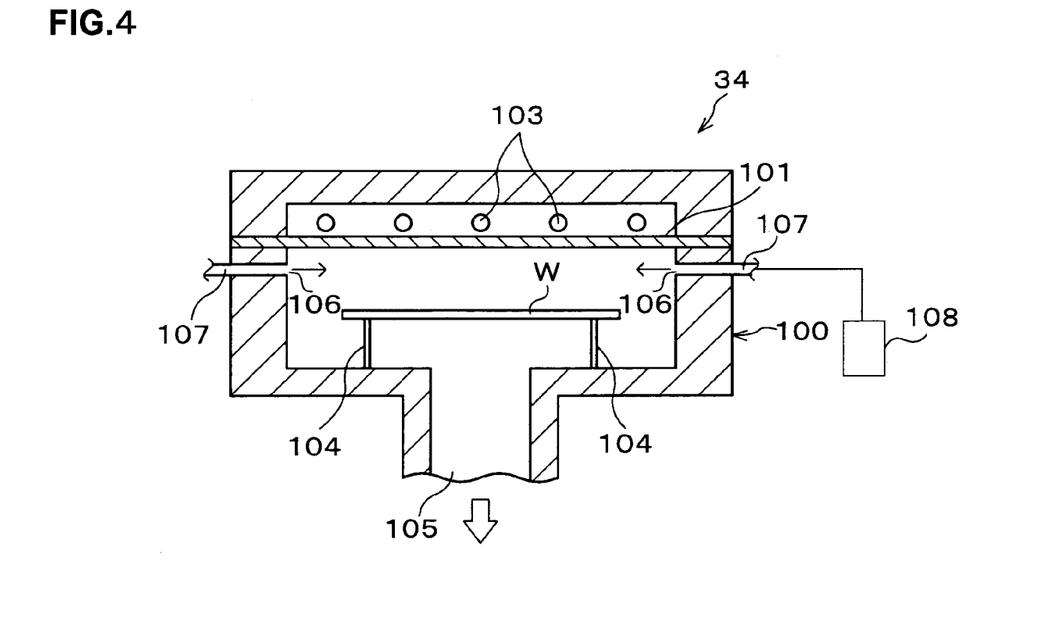
FIG. 4 is an explanatory view of a vertical section showing an outline of a constitution of an annealing apparatus.

In the annealing apparatus 34, for example, a transparent quartz glass plate 101 is horizontally bridged at an upper portion inside of an approximately cylindrical process vessel 100, as shown in FIG. 4. For example, lamps 103 are disposed at a space between the quartz glass plate 101 and a ceiling surface of the process vessel 100 as heating sources. Support pins 104 supporting the substrate W at a center portion inside of the process vessel 100 are provided on a bottom surface of the process vessel 100. An exhaust port 105 leading to an evacuation means (not shown) is formed on a bottom surface of the process vessel 100. Gas supply ports 106 are provided at lower sides of the quartz glass plate 101 on a sidewall of the process vessel 100. The gas supply port 106 is communicated with, for example, a gas supply source 108 of Ar gas via a gas supply pipe 107, and it is possible to supply the Ar gas into the process vessel 100. Incidentally, the annealing apparatus 35 has the same constitution as the annealing apparatus 34, and therefore, the description thereof will not be given.

Next, substrate processes performed at the substrate processing apparatus 1 constituted as stated above are described. At first, inside of the carrier path 8 of the substrate processing apparatus 1 shown in FIG. 1 is maintained to be, for example, a nitride atmosphere not containing oxygen owing to the supply of gas from, for example, the air supply pipe 21 and the exhaust from the exhaust pipe 23. Subsequently, the cassette C accommodating the substrate W before the insulating film is formed is mounted on the cassette mounting table 4, and the substrate W inside of the cassette C is taken out by the substrate carrier 6 and carried to the pre-alignment stage 7. The substrate W performed an alignment at the pre-alignment stage 7 is carried to the load lock chamber 30 by, for example, the substrate carrier 6 via the gate valve 37. The substrate W at the load lock chamber 30 is carried to the insulating film forming apparatus 32 by the substrate carrier apparatus 39 while passing through the carrier path 8.

The substrate W carried to the insulating film forming apparatus 32 is mounted on the mounting table 51 inside of the process vessel 50 as shown in FIG. 2. The substrate W mounted on the mounting table 51 is heated to be 200° C. or less, for example, at approximately 80° C. by the heat generation of the heater 52. Subsequently, the exhaust inside of the process vessel 50 is started by the exhaust apparatuses 91, and the pressure inside of the process vessel 50 is reduced to be, for example, 6.67 Pa (50 mTorr) or less, for example, to be approximately 2.67 Pa (20 mTorr).

Besides, the Ar gas being plasma gas is supplied into the process vessel 50 from the gas supply port 70 toward the plasma generation region R1. The microwave of, for example, 2.45 GHz is emitted from the radial line slot antenna 62 toward the plasma generation region R1 immediately below. The Ar gas becomes the plasma at the plasma generation region R1 by the emission of this microwave. At this time, the microwave emitted from the radial line slot antenna 62 is reflected by the source gas supply structure 80, and remains inside of the plasma generation region R1. As a result, a high density plasma space is formed inside of the plasma generation region R1. Incidentally, a bias voltage is not applied to the substrate W mounted on the mounting table 51 in this deposition process.

On the other hand, the charged particles of the plasma generated within the plasma generation region R1 diffuse into the film formation region R2 through the opening portions 82 of the source gas supply structure 80. The butyne gas being the source gas is supplied to the film formation region R2 from the source gas supply ports 83 of the source gas supply structure 80. The butyne gas is activated by, for example, a plasma energy diffused from the plasma generation region R1, and an insulating film of amorphous carbon composed of hydrogen atom and carbon atom is formed on the substrate W.

When the insulating film with a predetermined thickness is formed on the substrate W, for example, the emission of the microwave and the supplies of the butyne gas and the Ar gas are stopped, and the substrate W on the mounting table 51 is carried out from the process vessel 50 by the substrate carrier apparatus 39. The substrate W carried out from the insulating film forming apparatus 32 is carried to the annealing apparatus 34 while passing through inside of the carrier path 8. During this time, inside of the carrier path 8 is maintained to be a nitrogen atmosphere, and therefore, the insulating film on the substrate W does not react with oxygen.

The substrate W carried to the annealing apparatus 34 is supported on the support pins 104 as shown in FIG. 4. The exhaust is performed from the exhaust pipe 105, and the pressure inside of the process vessel 100 is reduced to be, for example, 120 Pa (900 mTorr). The Ar gas is supplied from the gas supply port 106, and inside of the process vessel 100 is maintained to the atmosphere of the Ar gas. The substrate W is then heated at the temperature in a range of 300° C. to 400° C., for example at 400° C. by heat irradiations from the lamps 103. The insulating film is sintered by this heating.

The substrate W heated for a predetermined time is carried out from the annealing apparatus 34 by the substrate carrier apparatus 39, and carried to, for example, the load lock chamber 31 passing through the carrier path 8. After that, the substrate W is accommodated in the cassette C on the cassette mounting table 4 by the substrate carrier 6 to complete a series of substrate processes in the substrate processing apparatus 1.

Here, characteristics of the insulating film formed by the above-stated substrate processes are verified. At first, when the deposition process is performed according to conditions of the substrate processes of the above-stated embodiment by using the butyne gas as the source gas, a value of a dielectric constant (k value) of the insulating film was approximately 2.5. The dielectric constant in this case becomes significantly lowered compared to the k value of 3.5 when the source gas is conventional $CH_4$ (methane) gas having a single bond.

Besides, when the annealing process is performed in the Ar gas atmosphere, the heating temperature of 400° C., and the pressure of 120 Pa after the insulating film is deposited as the present embodiment, a shrinkage (a ratio of a film thickness of the insulating film after the annealing process relative to the film thickness before the annealing process) at the time of the annealing process was approximately 1.00. On the contrary, when the annealing process is performed with the same condition as the above-stated embodiment after the insulating film is deposited according to a conventional condition, namely, by using the methane gas as the source gas, the shrinkage was approximately 0.73. As stated above, the shrinkage at the time of the annealing process goes up significantly, and a heat resistance of the insulating film is improved.

Consequently, it is possible to form the insulating film of amorphous carbon having lower dielectric constant and better heat resistance compared to the prior art by supplying the butyne gas as the source gas at the time of the deposition process as the present embodiment.

Incidentally, according to the inventor, it is verified that the insulating film of amorphous carbon having lower dielectric constant and better heat resistance compared to the prior art can be formed by using other hydrocarbon gas having the multiple bond, for example, the one having a double bond such as $C_2H_4$ (ethylene) gas, or the one having a triple bond such as $C_2H_2$ (acetylene) gas, $C_5H_{10}$ (pentyne) (1-pentyne, 2-pentyne) gas instead of the butyne gas. Consequently, the source gas supplied at the time of the deposition is not limited to the butyne gas, but it may be other hydrocarbon gas having the multiple bond. Incidentally, 2-butyne gas is more preferable among the butyne gases.

Figure 5:
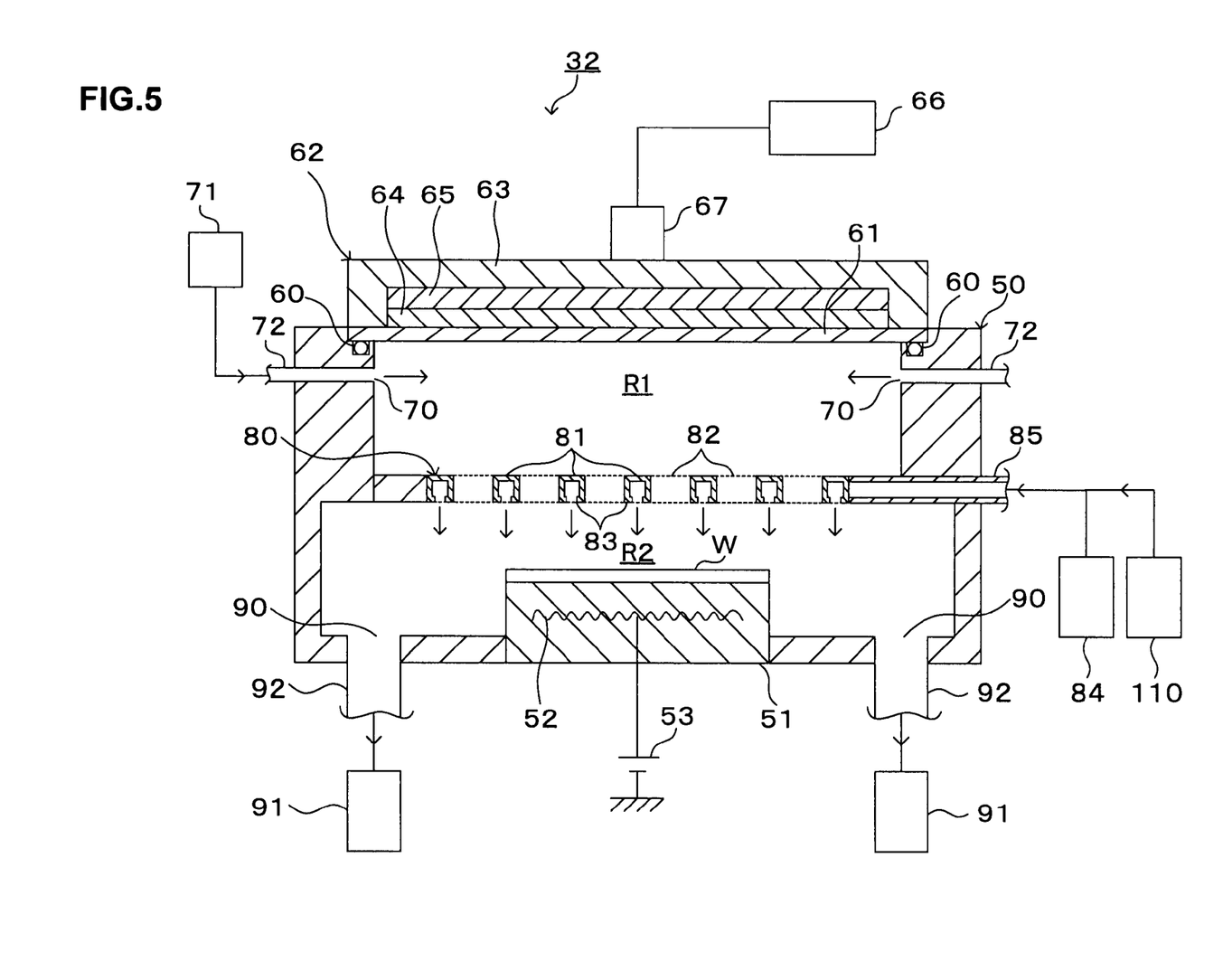
FIG. 5 is an explanatory view of a vertical section showing an outline of a constitution of an insulating film forming apparatus including a gas supply source of hydrogen gas.

In the embodiment as stated above, the butyne gas is supplied into the process vessel 50 as the source gas, but the hydrogen gas may be supplied in addition to the $C_2H_2$ (acetylene) gas having the triple bond. In such a case, for example, a gas supply source 110 of the hydrogen gas is connected to the gas supply pipe 85 of the insulating film forming apparatus 32 as shown in FIG. 5. Besides, the acetylene gas is stored at the gas supply source 84. When a film is formed, the acetylene gas and the hydrogen gas are supplied from the gas supply ports 83 to the film formation region R2, and the insulating film of amorphous carbon composed of hydrogen atom and carbon atom is formed on the substrate W.

In such a case, the value of the dielectric constant (k value) of the insulating film formed finally becomes to be approximately 2.5, and the dielectric constant can be significantly eliminated compared to the conventional method.

Figure 6:
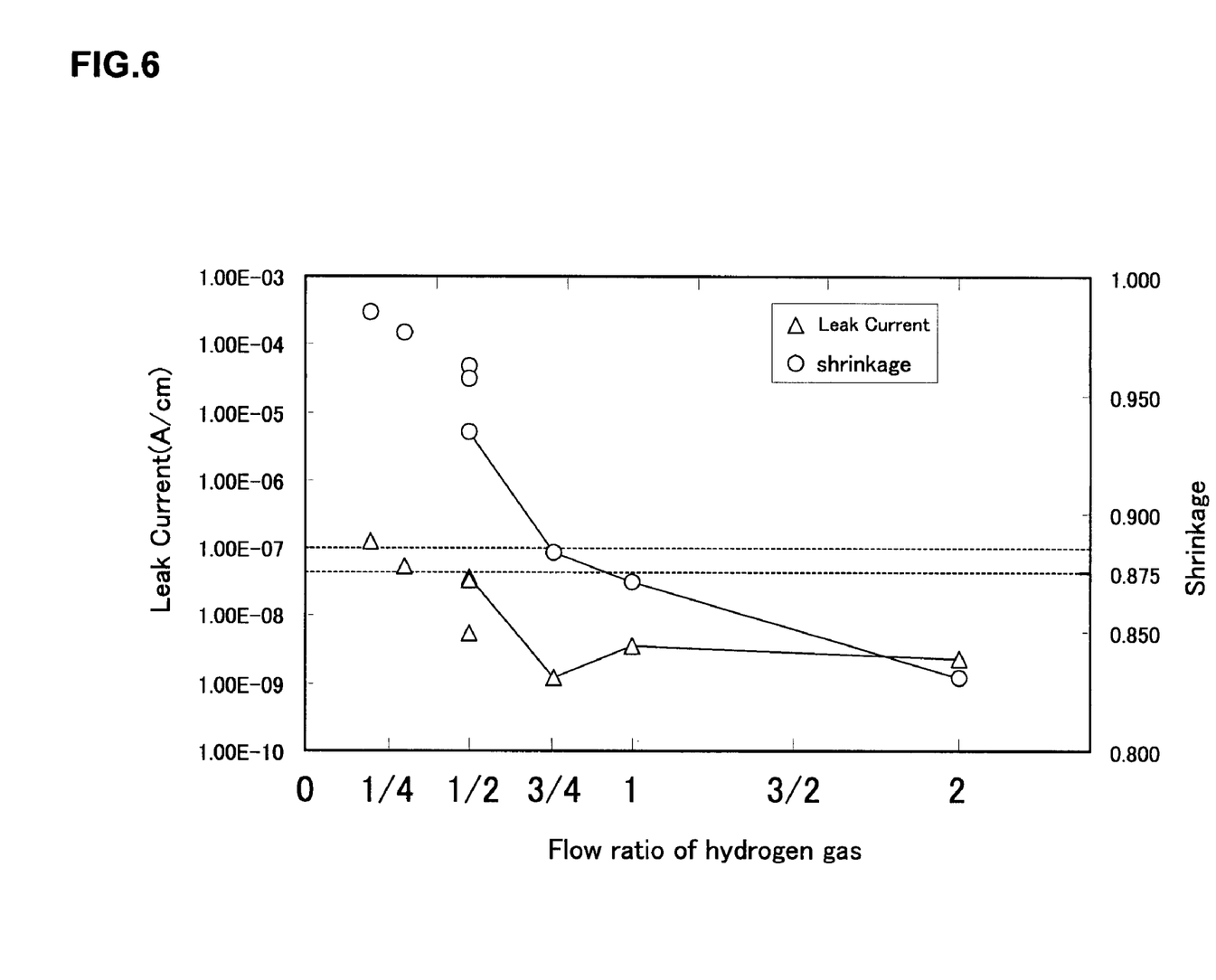
FIG. 6 is a graphic chart showing a relation of a mixing ratio of the hydrogen gas, a leak current and a shrinkage.

FIG. 6 is a graphic chart showing a relation of a mixing ratio of the hydrogen gas relative to the acetylene gas, a leak current of the insulating film, and the shrinkage. It can be verified that if the hydrogen gas is added to the acetylene gas, the leak current is lowered as shown in FIG. 6. Consequently, the leak current of the insulating film can be eliminated by adding the hydrogen gas to the acetylene gas being the source gas at the time of the deposition as the above-stated embodiment.

Besides, as shown in FIG. 6, the more the hydrogen gas is added to the acetylene, the lower the leak current tends to be. When the hydrogen gas is supplied relative to the acetylene gas with a flow ratio of 4:1 or more, the leak current can be suppressed to be $1 \times 10^{-7}$ (A/cm) or less. On the other hand, as shown in FIG. 6, when the ratio of the hydrogen gas is increased, the shrinkage is lowered and the heat resistance tends to be decreased. When the hydrogen gas is supplied relative to the acetylene gas with the flow ratio of 4:3 or less, the shrinkage can be maintained to be 0.875 or more which is significantly higher than a conventional value. Consequently, the insulating film with the shrinkage of 0.875 or more and the leak current of $1 \times 10^{-7}$ (A/cm) or less, namely the insulating film having extremely good heat resistance and extremely low leak current can be formed by supplying the acetylene gas and the hydrogen gas with the flow ratio (volume ratio) of approximately 4:3 to 4:1 at the time of the deposition. Incidentally, it is preferable that the acetylene gas and the hydrogen gas are to be supplied with the mixing ratio of approximately 2:1.

Figure 8:
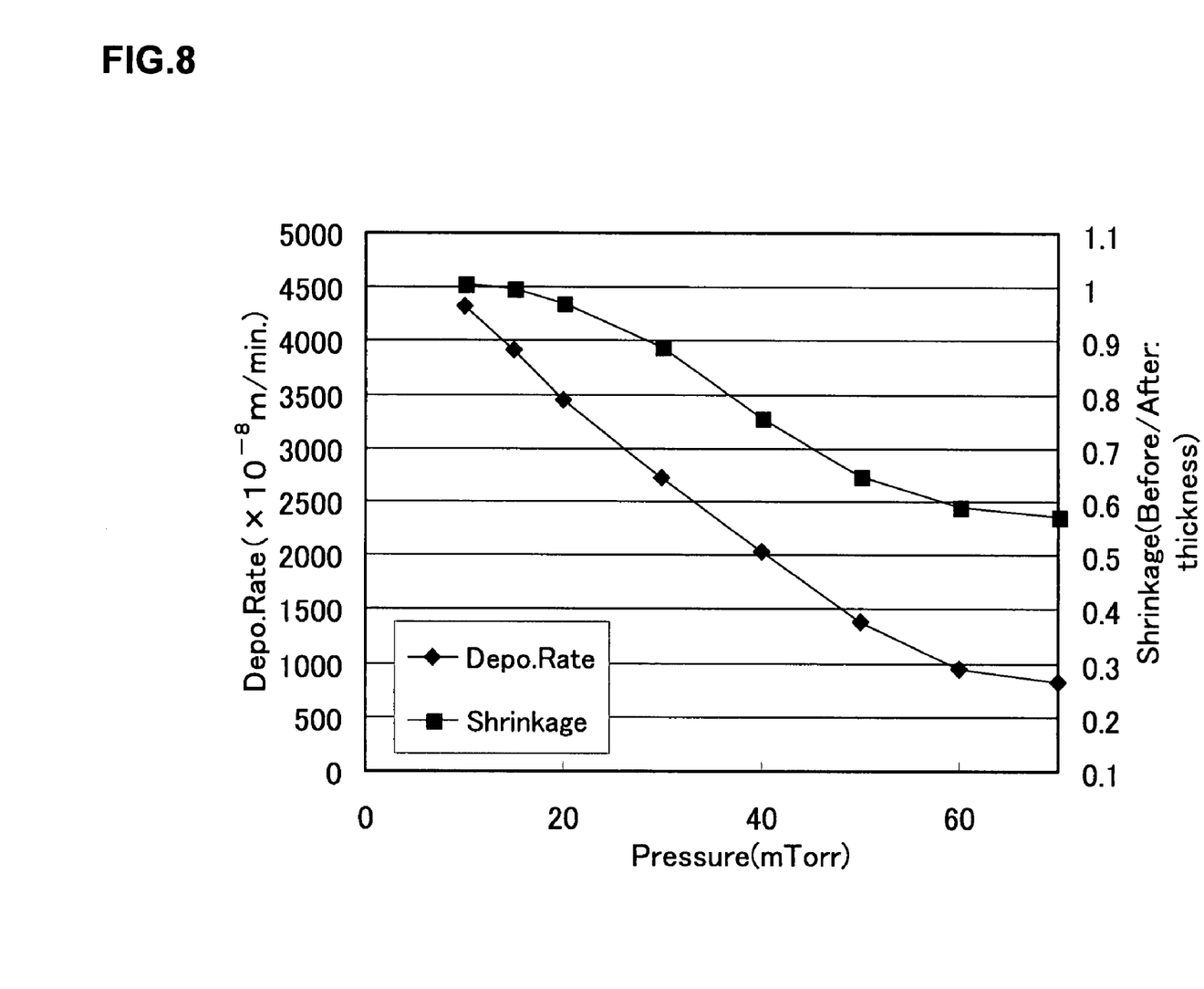
FIG. 8 is a graphic chart showing a relation of a pressure inside of a process vessel, a shrinkage and a deposition rate at a time of a deposition.

When the acetylene gas and the hydrogen gas are supplied at the time of the deposition as stated above, the pressure inside of the process vessel 50 may be maintained to be 4.0 Pa (30 mTorr) or less. FIG. 8 is an experimental data showing a relation between the pressure inside of the process vessel 50, the shrinkage, and a deposition rate at the time of the deposition. As shown in FIG. 8, when the pressure inside of the process vessel 50 at the time of the deposition is set to be 4.0 Pa or less, the shrinkage becomes 0.85 or more, and the deposition rate becomes $2500 \times 10^{-8}$ m/min or more. As stated above, the pressure inside of the process vessel 50 at the time of the deposition is maintained to be 4.0 Pa (30 mTorr) or less, and thereby, the insulating film having high heat resistance can be formed in a short time. Incidentally, the pressure inside of the process vessel 50 is desirable to be approximately 1.33 Pa (10 mTorr) to 4.0 Pa.

Figure 7:
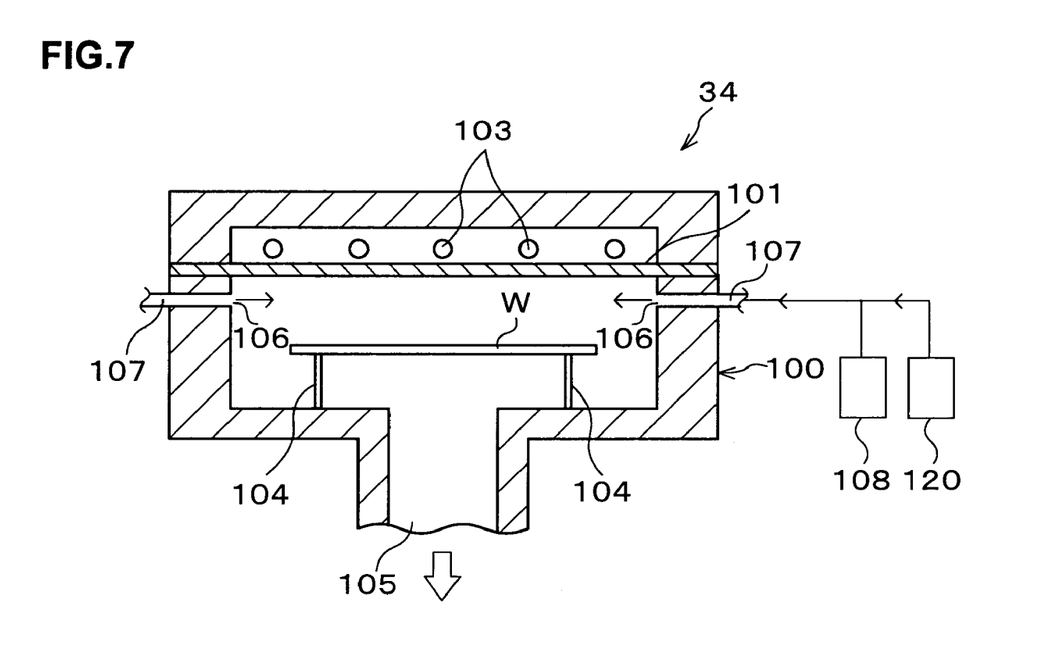
FIG. 7 is an explanatory view of a vertical section showing an outline of a constitution of an annealing apparatus including a gas supply source of the hydrogen gas.
Figure 9:
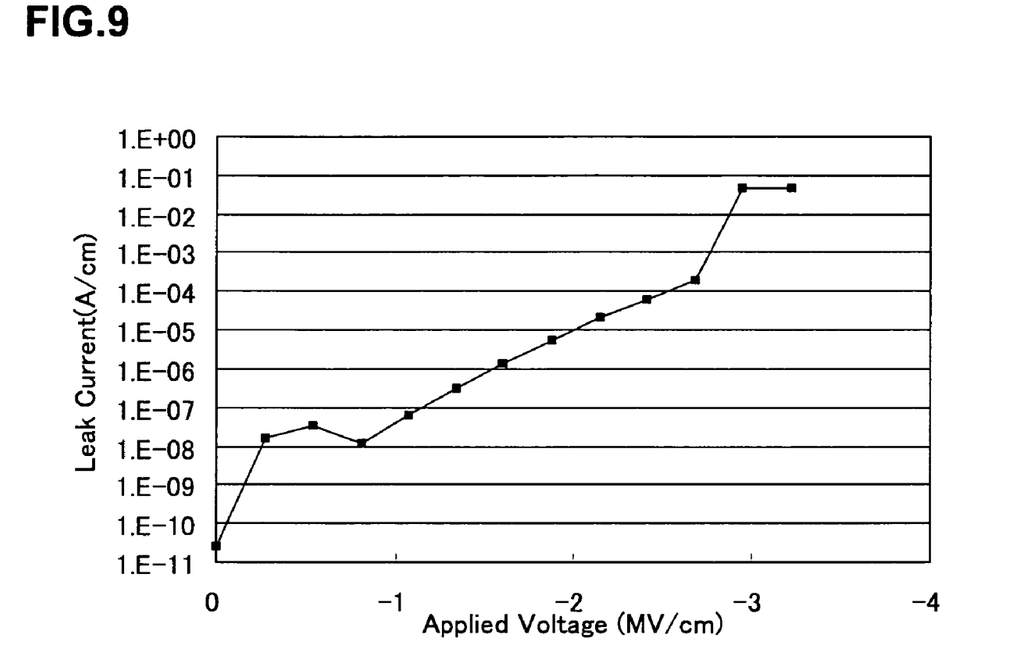
FIG. 9 is a graphic chart showing a leak current relative to each applied voltage as for an insulating film in which the hydrogen gas is supplied at a time of an annealing process.
Figure 10:
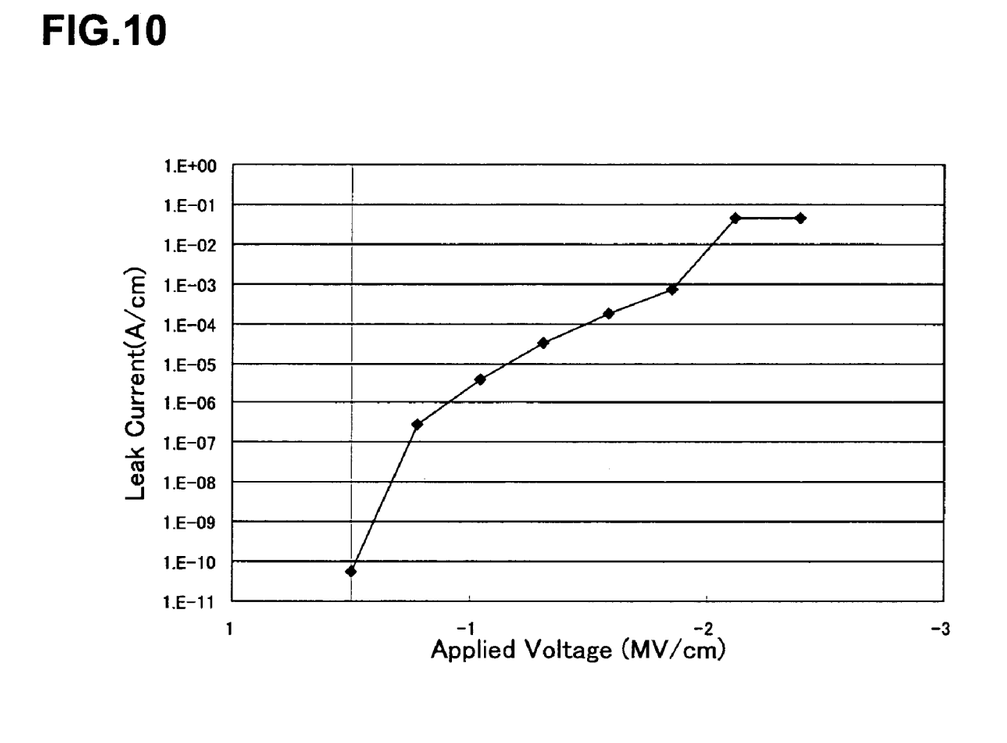
FIG. 10 is a graphic chart showing a leak current relative to each applied voltage as for an insulating film formed by a conventional substrate process.

In the embodiments as stated above, the hydrogen gas may be supplied into the process vessel 100 in addition to the Ar gas at the time of the annealing process. In such a case, for example, a gas supply source 120 of the hydrogen gas is connected to the gas supply pipe 107 of the annealing apparatus 34 as shown in FIG. 7. At the time of the annealing process, the Ar gas and the hydrogen gas are supplied into the process vessel 100 from the gas supply port 106 with a volume ratio of, for example, 12:1. Herewith, the substrate W is annealing processed in an atmosphere containing the hydrogen gas. As shown in this example, when the substrate W is maintained in the atmosphere containing the hydrogen gas at the time of the annealing process, the k value of the insulating film decreases to be approximately 2.4. Besides, FIG. 9 is a graphic chart showing the leak current relative to each applied voltage as for the insulating film formed by this example. FIG. 10 is a graphic chart showing the leak current relative to each applied voltage of the insulating film formed without adding the hydrogen gas as a conventional manner. It can be seen that the leak current of the insulating film when the hydrogen gas is added (FIG. 9) becomes lower by comparing FIG. 9 and FIG. 10. Besides, according to a verification of the inventor, the shrinkage at the time of the annealing process becomes to be approximately 0.95 according to this example. As stated above, it is possible to form the insulating film with low dielectric constant, good heat resistance, and little leak current by exposing the substrate W in the atmosphere containing the hydrogen gas at the time of the annealing process.

As stated above, an example according to the embodiment of the present invention is described, but the present invention is not limited to this example and may be embodied in various forms. For example, the plasma gas described in the present embodiment is not limited to the Ar gas, but other gases such as xenon gas, krypton gas can be used. Besides, the present invention is not limited to the above-stated insulating film forming apparatus 32 using the microwave, but it can be applied to substrate processes using other deposition apparatuses, for example, a plasma CVD apparatus using an electron cyclotron resonance, an ICP plasma apparatus, and so on. The present invention may be applied to the substrate processes by a remote plasma apparatus in which a region generating the plasma and a film formation region performing a deposition to a substrate by active species are sectionalized as in the above-stated embodiment. Besides, the present invention can be applied to a process of a substrate such as a semiconductor wafer, an LCD substrate, an organic EL substrate, and a glass substrate for a photomask.

What is claimed is:

1. A substrate processing method, comprising the steps of:
    forming an insulating film of amorphous carbon on a substrate by supplying acetylene gas and hydrogen gas with a volume ratio of 4:3 to 4:1 into a process vessel in which the substrate is accommodated, and generating a plasma inside of the process vessel by emitting a microwave, wherein a pressure inside of the process vessel is maintained to be between 1.33 and 4.0 Pa and the substrate is maintained to be 200° C. or less while the insulating film is formed.

2. The substrate processing method according to claim 1, wherein the substrate is heated in an atmosphere containing additional hydrogen gas after the insulating film is formed.

3. The substrate processing method according to claim 2, wherein the substrate is heated at a temperature between 350° C. and 400° C. after the insulating film is formed.

4. The substrate processing method according to claim 2, wherein the substrate is maintained in an atmosphere not containing oxygen during a period after the insulating film is formed until the substrate is heated.

5. The substrate processing method according to claim 1, wherein inside of the process vessel is sectionalized into a plasma generation region in which the plasma is generated, and a film formation region in which the insulating film is formed on the substrate by using the plasma generated in the plasma generation region,
    wherein plasma gas to generate the plasma is supplied to the plasma generation region, and
    wherein the hydrocarbon gas is supplied to the film formation region.

6. The substrate processing method according to claim 1, wherein the plasma is generated inside of the process vessel under a state in which a bias voltage is not applied to the substrate inside of the process vessel.

7. The substrate processing method according to claim 1, wherein said microwave is emitted from a radial line slot antenna.

8. The substrate processing method according to claim 1, wherein the substrate is heated at a temperature between 350° C. and 400° C. after the insulating film is formed.

9. A substrate processing method, comprising the steps of:
    forming an insulating film of amorphous carbon on a substrate by supplying butyne gas into a process vessel in which the substrate is accommodated, and generating a plasma inside of the process vessel by emitting a microwave,
    wherein a pressure inside of the process vessel is maintained to be between 1.33 and 4.0 Pa and the substrate is maintained to be 200° C. or less while the insulating film is formed.

10. The substrate processing method according to claim 9, wherein the substrate is heated in an atmosphere containing additional hydrogen gas after the insulating film is formed.

11. The substrate processing method according to claim 10, wherein the substrate is heated at a temperature between 350° C. and 400° C. after the insulating film is formed.

12. The substrate processing method according to claim 9, wherein the substrate is heated at a temperature between 350° C. and 400° C. after the insulating film is formed.

* * * * *